United States Patent
Dhas (10) Patent No.: US 9,570,289 B2
(45) Date of Patent: Feb. 14, 2017

(54) METHOD AND APPARATUS TO MINIMIZE SEAM EFFECT DURING TEOS OXIDE FILM DEPOSITION

(71) Applicant: Lam Research Corporation, Fremont, CA (US)

(72) Inventor: Arul N. Dhas, Tualatin, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/640,207

(22) Filed: Mar. 6, 2015

(65) Prior Publication Data

US 2016/0260603 A1 Sep. 8, 2016

(51) Int. Cl.
| | |
|---|---|
| *H01L 21/67* | (2006.01) |
| *H01L 21/02* | (2006.01) |
| *C23C 16/50* | (2006.01) |
| *C23C 16/455* | (2006.01) |
| *C23C 16/52* | (2006.01) |

(52) U.S. Cl.
CPC ... *H01L 21/02274* (2013.01); *C23C 16/45544* (2013.01); *C23C 16/45565* (2013.01); *C23C 16/50* (2013.01); *C23C 16/52* (2013.01); *H01L 21/02164* (2013.01)

(58) Field of Classification Search
CPC .................. H01L 21/02274; H01L 21/02337; H01L 21/67207; C23C 16/45574; C23C 16/45565; C23C 16/452
See application file for complete search history.

(56) References Cited

U.S. PATENT DOCUMENTS

| | | | |
|---|---|---|---|
| 4,872,947 A * | 10/1989 | Wang | C23C 16/402 118/50.1 |
| 7,480,974 B2 * | 1/2009 | Steger | C23C 16/45565 156/345.34 |
| 7,645,486 B2 | 1/2010 | Bourdelle et al. | |
| 7,658,800 B2 | 2/2010 | Chen et al. | |
| 7,704,894 B1 | 4/2010 | Henri et al. | |
| 7,709,063 B2 * | 5/2010 | Yuda | C23C 16/402 118/723 E |
| 7,745,346 B2 | 6/2010 | Hausmann et al. | |
| 7,923,376 B1 | 4/2011 | Dhas et al. | |
| 8,017,527 B1 | 9/2011 | Dhas et al. | |
| 8,034,725 B1 | 10/2011 | Henri et al. | |

(Continued)

*Primary Examiner* — John C Ingham
(74) *Attorney, Agent, or Firm* — Buchanan Ingersoll & Rooney PC (57) ABSTRACT

A method of minimizing a seam effect of a deposited TEOS oxide film during a trench filling process performed on a semiconductor substrate in a semiconductor substrate plasma processing apparatus comprises supporting a semiconductor substrate on a pedestal in a vacuum chamber thereof. Process gas including TEOS, an oxidant, and argon is flowed through a face plate of a showerhead assembly into a processing region of the vacuum chamber. RF energy energizes the process gas into a plasma wherein TEOS oxide film is deposited on the semiconductor substrate so as to fill at least one trench thereof. The argon is supplied in an amount sufficient to increase the electron density of the plasma such that the deposition rate of the TEOS oxide film towards the center of the semiconductor substrate is increased and the seam effect of the deposited TEOS oxide film in the at least one trench is reduced.

19 Claims, 6 Drawing Sheets

(56) References Cited

U.S. PATENT DOCUMENTS

| | | |
|---|---|---|
| 8,137,467 B2 | 3/2012 | Meinhold et al. |
| 8,486,792 B2 | 7/2013 | Ueda et al. |
| 8,557,712 B1 | 10/2013 | Antonelli et al. |
| 8,580,697 B1 | 11/2013 | Lang et al. |
| 8,628,618 B2 | 1/2014 | Slevin et al. |
| 8,673,080 B2 | 3/2014 | Meinhold et al. |
| 8,728,955 B2 | 5/2014 | LaVoie et al. |
| 8,759,234 B2 | 6/2014 | Chang et al. |
| 8,809,161 B2 | 8/2014 | Gauri et al. |
| 8,840,754 B2 | 9/2014 | Hao |
| 8,941,210 B2 | 1/2015 | Kim |
| 2001/0049202 A1* | 12/2001 | Maeda ............... H01L 21/02129 438/778 |
| 2005/0126484 A1 | 6/2005 | Zhao et al. |
| 2005/0196533 A1* | 9/2005 | Hasebe ................. C23C 16/045 427/248.1 |
| 2011/0146571 A1 | 6/2011 | Bartlett et al. |
| 2011/0151142 A1 | 6/2011 | Seamons et al. |
| 2013/0288485 A1 | 10/2013 | Liang et al. |
| 2014/0106574 A1 | 4/2014 | Kang et al. |
| 2014/0118751 A1 | 5/2014 | Rajagopalan et al. |
| 2014/0141542 A1 | 5/2014 | Kang et al. |
| 2014/0162384 A1 | 6/2014 | Joshi |
| 2014/0179114 A1 | 6/2014 | van Schravendijk |
| 2014/0216337 A1 | 8/2014 | Swaminathan et al. |
| 2014/0272185 A1 | 9/2014 | Na et al. |
| 2014/0291745 A1 | 10/2014 | Chang et al. |

\* cited by examiner

FIG. 5B
(detail J)

METHOD AND APPARATUS TO MINIMIZE SEAM EFFECT DURING TEOS OXIDE FILM DEPOSITION

FIELD OF THE INVENTION

Embodiments disclosed herein pertain to methods and apparatus for depositing dielectric film on a semiconductor substrate during semiconductor substrate processing, and more particularly to methods and apparatus for minimizing seam effect during TEOS oxide film deposition.

BACKGROUND

TEOS (tri-ethoxy-organo-silicate) is a silicon-containing compound that is a liquid at room temperature. TEOS is used in many applications to deposit dielectric film on a substrate, e.g., in place of silane. TEOS is used in applications where conformality is required as silicon dioxide (or "TEOS oxide") films deposited by TEOS chemical vapor deposition processes have good conformality. TEOS oxide is often deposited by a plasma enhanced deposition chemical vapor deposition (PECVD) process.

TEOS-based PECVD processes typically involve exposing a substrate to a process gas including TEOS and an oxidant such as oxygen or ozone. TEOS oxide deposition during trench filling processes of semiconductor substrate processing may result in the formation of uneven deposition and step coverage which may lead to voids and/or seams forming in the deposited film due to overhang of deposited material which was deposited on a side wall of the trench (i.e. the seam effect). Thus, it would be desirable to have high deposition rate, high purity, processes for depositing TEOS oxide films wherein defects such as the seam effect are minimized.

SUMMARY

Disclosed herein is a method of minimizing a seam effect of a deposited TEOS oxide film during a trench filling process performed on a semiconductor substrate in a semiconductor substrate plasma processing apparatus. The method comprises supporting a semiconductor substrate on a pedestal in a vacuum chamber of the semiconductor substrate plasma processing apparatus wherein the semiconductor substrate includes at least one trench in an upper surface thereof. Process gas including TEOS, an oxidant, and argon is flowed through a face plate of a showerhead assembly of the semiconductor substrate plasma processing apparatus into a processing region of the vacuum chamber above the upper surface of the semiconductor substrate. RF energy is supplied into the processing region of the vacuum chamber with at least one RF generator to energize the process gas into a plasma wherein TEOS oxide film is deposited on the upper surface of the semiconductor substrate so as to fill the at least one trench thereof wherein the argon is supplied in an amount sufficient to increase the electron density of the plasma such that the deposition rate of the TEOS oxide film towards the center of the semiconductor substrate is increased and the seam effect of the deposited TEOS oxide film in the at least one trench is reduced.

Also disclosed herein is a showerhead assembly of a semiconductor substrate plasma processing apparatus. The showerhead assembly comprises a face plate including a lower wall and an annular outer wall extending upwardly from an outer periphery of the lower wall, and a back plate wherein an outer periphery of the back plate is welded to the upwardly extending annular wall of the face plate such that a cavity is formed between the lower wall of the face plate and the back plate. The lower wall of the face plate includes at least 6,000 gas injection holes that extend therethrough wherein the at least 6,000 gas injection holes are spatially arranged in the lower wall of the face plate such that process gas delivered into the cavity and ejected through the at least 6,000 gas injection holes minimizes a seam effect of TEOS oxide film deposited in at least one trench of a semiconductor substrate during a TEOS oxide trench filling operation.

DETAILED DESCRIPTION

In the following detailed disclosure, exemplary embodiments are set forth in order to provide an understanding of the apparatus and methods disclosed herein. However, as will be apparent to those skilled in the art, that the exemplary embodiments may be practiced without these specific details or by using alternate elements or processes. In other instances, well-known processes, procedures, and/or components have not been described in detail so as not to unnecessarily obscure aspects of embodiments disclosed herein. Like numerals in the figures indicate like elements. As used herein the term "about" refers to ±10%.

Tri-ethoxy-organo-silicate ("TEOS") is a silicon-containing compound that is a liquid at room temperature and that is used in many applications to deposit TEOS oxide films on semiconductor substrates in semiconductor substrate plasma processing apparatuses. TEOS is often used in place of silane for applications that require good conformality, for example, when the semiconductor substrate surface contains recessed features or other irregularities.

Silicon dioxide films deposited using TEOS (also called TEOS oxide films or TEOS films) may be deposited by plasma-enhanced chemical vapor deposition processes, or plasma enhanced atomic layer deposition processes, using a process gas containing TEOS and an oxidant, typically oxygen or ozone.

Embodiments of methods disclosed herein can be implemented in a plasma enhanced chemical vapor deposition (PECVD) reactor, or alternatively a plasma enhanced atomic layer deposition (PEALD) reactor. Such reactors may take many different forms. The apparatus may include one or more vacuum chambers (chamber) or "reactors" (sometimes including multiple stations) that each may house one or more semiconductor substrates and are suitable for semiconductor substrate plasma processing. The one or more chambers maintain the semiconductor substrate in a defined position or positions (with or without motion within that position, e.g. rotation, vibration, or other agitation). In one embodiment, a semiconductor substrate undergoing deposition processing is transferred from one station to another within a reactor chamber during the processing. For example, if 2,000 Å of film is desired to be deposited on an upper surface of a semiconductor substrate, 500 Å of film may be deposited on the upper surface of the semiconductor substrate at each of four stations in accordance with embodiments disclosed herein. Alternatively, the TEOS oxide film deposition may occur entirely at a single station or any fraction of the total film thickness may be deposited at any number of stations.

During processing, each semiconductor substrate is held in place by a pedestal (i.e., a semiconductor substrate support), an electrostatic chuck, and/or other substrate holding apparatus. For certain operations in which the semiconductor substrate is to be heated, the substrate support or pedestal may include a heater such as a heating plate.

Figure 1:
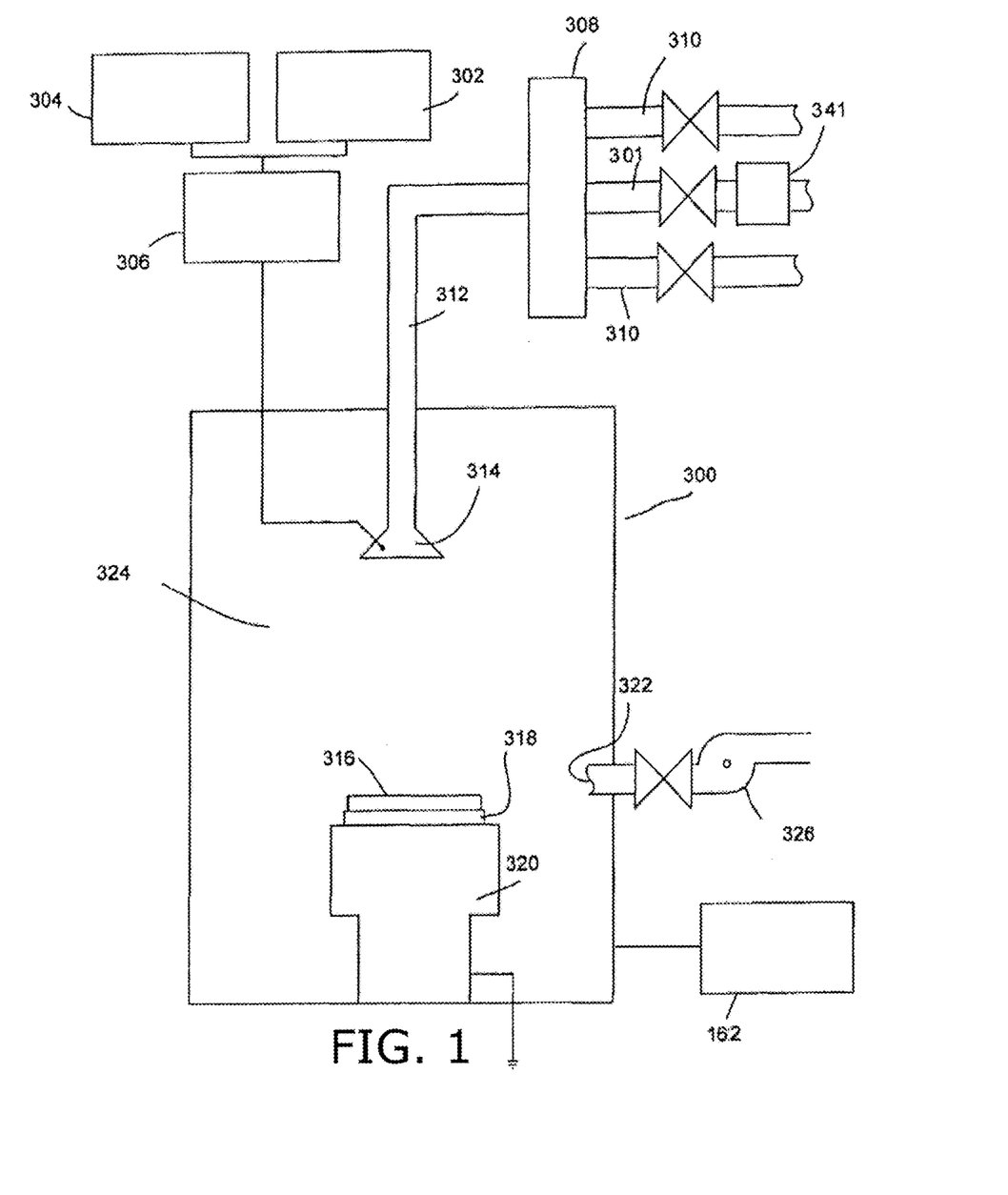
FIG. 1 shows a schematic illustration of a semiconductor substrate processing apparatus operable to perform methods of depositing TEOS oxide films as disclosed herein.

FIG. 1 provides a simple block diagram depicting various reactor components arranged for implementing embodiments as disclosed herein. As shown, a semiconductor substrate plasma processing apparatus 300 includes a vacuum chamber 324, which encloses other components of the reactor and serves to contain the plasma generated by a capacitor type system including a showerhead assembly 314 working in conjunction with a grounded heater block 320. At least one RF generator is operable to supply RF energy into a processing region above an upper surface of a semiconductor substrate 316 in the vacuum chamber 324 to energize process gas supplied into the processing region of the vacuum chamber 324 into plasma such that a plasma deposition process may be performed in the vacuum chamber 324. For example, a high-frequency RF generator 302 and a low-frequency RF generator 304 may each be connected to a matching network 306, which is connected to the showerhead assembly 314 such that RF energy may be supplied to the processing region above the semiconductor substrate 316 in the vacuum chamber 324. The power and frequency of RF energy supplied by matching network 306 to the interior of the vacuum chamber 324 is sufficient to generate plasma from the process gas. In an embodiment, the high-frequency RF generator 302 is operated at a frequency of about 2-60 MHz, and in a preferred embodiment, the high-frequency RF generator 302 is operated at a frequency of about 13.56 MHz. In an embodiment, the power of the high-frequency RF generator 302 is about 1100 to 1700 W. In an embodiment, the low-frequency RF generator 304 is operated at a frequency of about 50 to 800 kHz, preferably about 300 to 500 kHz, and the power of the low-frequency RF generator 304 is about 1,550 to 2,400 W.

Within the reactor, a semiconductor substrate pedestal 318 supports a semiconductor substrate 316. The pedestal can include a chuck, a fork, or lift pins to hold and transfer the semiconductor substrate during and between the deposition and/or plasma treatment processes. The chuck may be an electrostatic chuck, a mechanical chuck, vacuum chuck, or various other types of chuck as are available for use in the industry and/or research. Details of a lift pin assembly for a pedestal including an electrostatic chuck can be found in commonly-assigned U.S. Pat. No. 8,840,754, which is incorporated herein by reference in its entirety.

Process gases are introduced into the vacuum chamber 324 via inlet 312 and showerhead assembly 314. Multiple source gas lines 310 may be connected to a heated manifold 308. The gases may be premixed or not. Appropriate valving and mass flow control mechanisms are employed to ensure that the correct gases are delivered during plasma deposition. When a chemical precursor(s) is delivered in liquid form (such as liquid TEOS), liquid flow control mechanisms, such as a liquid precursor delivery system 341 and liquid supply line 301 may be employed to control the flow rate of the supplied liquid precursor wherein the liquid supplied by the liquid precursor delivery system 341 is heated above its vaporization point during its transportation to the heated manifold or in the heated manifold 308 and mixed with other process gases in the heated manifold 308 wherein the process gases including the vaporized liquid precursor, such as vaporized TEOS, are supplied through the showerhead assembly 314 to the vacuum chamber 324 wherein plasma deposition is subsequently performed. The flow rate of the liquid precursor, such as liquid TEOS, prior to vaporization corresponds to the amount of the subsequently vaporized precursor that is delivered into the vacuum chamber. Details of a liquid precursor delivery system for a deposition apparatus can be commonly assigned U.S. Pat. No. 8,017,527, which is incorporated by reference herein in its entirety.

Process gases may exit the vacuum chamber 324 via an outlet 322. A vacuum pump 326 (e.g., a one or two stage mechanical dry pump and/or a turbomolecular pump) may draw process gases out of the vacuum chamber 324 and maintain a suitably low pressure within the vacuum chamber 324 by a closed loop controlled flow restriction device, such as a throttle valve or a pendulum valve. Preferably, during TEOS oxide film deposition, the pressure in the vacuum chamber 324 is maintained at about 3-5 Torr, or about 4 Torr.

Figure 2A:
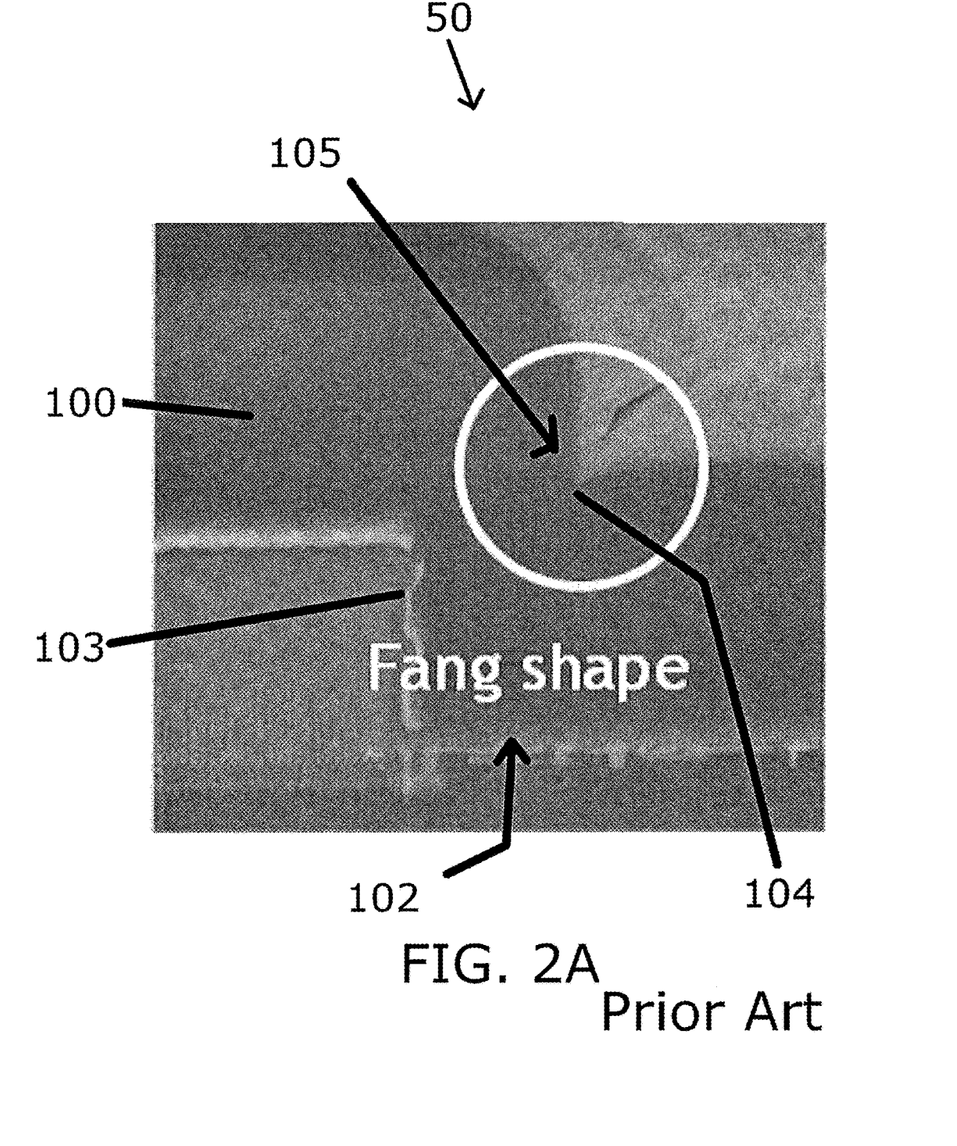
FIG. 2A shows the results of a prior art TEOS oxide deposition process on a DRAM cell feature of a semiconductor substrate.

As explained above, one of the concerns for the liquid based PECVD and/or PEALD processes is the formation of uneven deposition and/or step coverage in a trench filling process such as a TEOS oxide deposition process which forms a TEOS oxide layer 100. For example, as shown in FIG. 2A, a prior art TEOS oxide deposition process produces severe "over hang" deposition of TEOS oxide material on the side wall 103 of a trench 102 of a DRAM cell feature of a semiconductor substrate 50 which is filled with TEOS oxide material of the TEOS oxide layer 100. The severe "over hang" leads to the formation of "Fang" shape 105 and a sharp seam corner 104 formed in the TEOS oxide material of the TEOS oxide layer 100 in, for example, the DRAM cell structure wherein later processing, such as a wet clean process, may lead to voids, cracks and device failure.

Figure 2B:
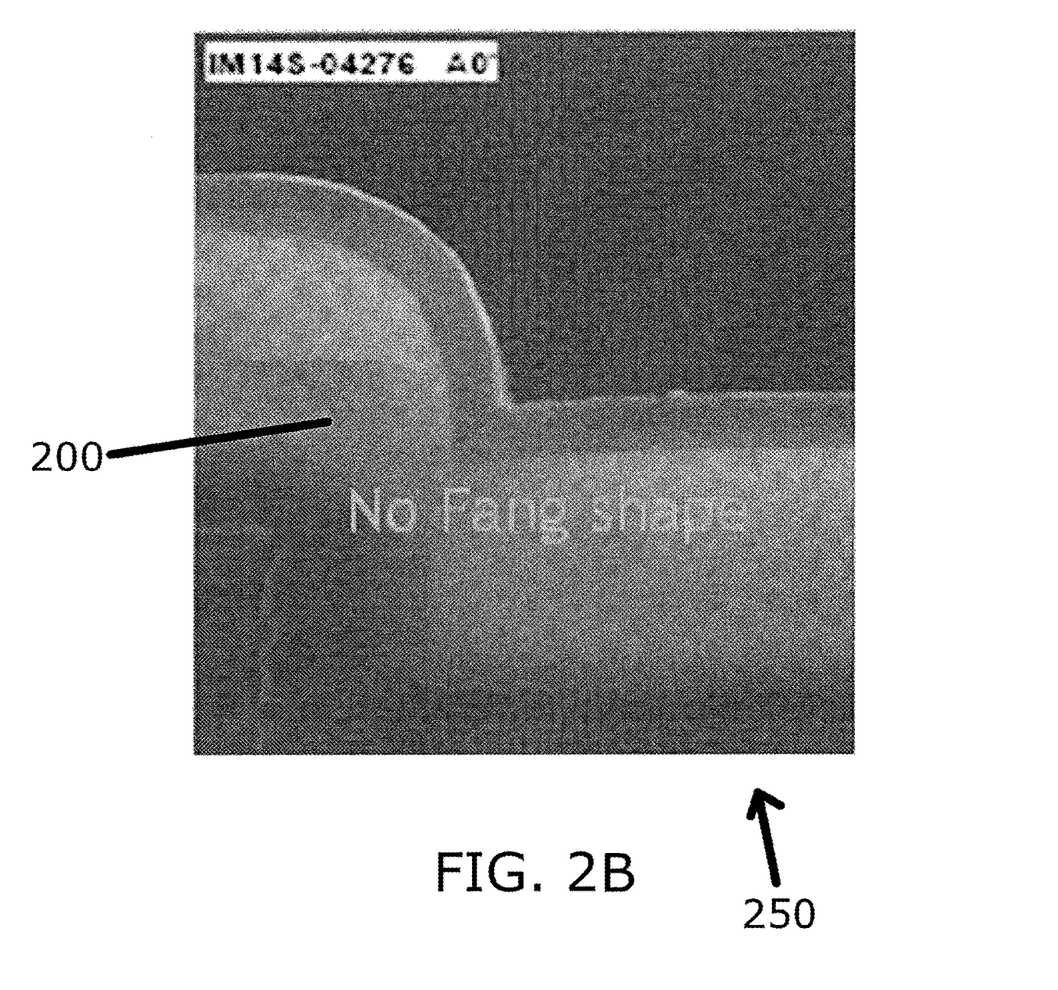
FIG. 2B shows the results of a TEOS oxide deposition process on a DRAM cell feature of a semiconductor substrate performed according to an embodiment as disclosed herein.

Embodiments of methods and apparatus disclosed herein minimize the seam effect of TEOS oxide deposition during a trench filling processes, such as a trench filling process during the formation of a DRAM cell feature of a semiconductor substrate. For example, FIG. 2B shows a processed semiconductor substrate 250 which has been processed according to an embodiment disclosed herein on an apparatus as disclosed herein after a trench filling process and wet clean process have been performed on the semiconductor substrate 250. As shown in FIG. 2B, the DRAM cell structure of the semiconductor substrate 250 does not have a sharp seam corner as the seam effect in the deposited TEOS oxide material of a TEOS oxide layer 200 has been minimized and a "Fang" shape has not been formed in the material of the deposited TEOS oxide layer 200. The thickness of the deposited TEOS oxide layer 200 is about 23500 Å, and as shown in FIG. 2B, the deposited TEOS oxide layer 200 is uniform across the cell feature, and there is a reduction (minimization) in the seam effect (i.e., a reduction in the seam angle which may act as a nucleation point for crack propagation and void formation).

In an embodiment, the method of depositing TEOS oxide includes providing a semiconductor substrate in a vacuum chamber of a semiconductor substrate plasma processing apparatus such as a PECVD or PEALD apparatus. The semiconductor substrate is preferably a semiconductor wafer having about a diameter of at least about 300 mm. Examples of applications of TEOS oxide films are described below. A process gas including TEOS in vapor form (TEOS gas), an oxidant, helium, and argon is then introduced to the vacuum chamber. Examples of oxidants can include oxygen and ozone. The process gas may also include one or more dopant gases, including carbon dioxide. TEOS oxide film may then be deposited on the substrate surface by a high deposition rate PECVD or PEALD reaction.

Initial deposition rates are preferably at least about 7,000 Å/minute. In an embodiment, initial deposition rates are at least at least about 8,000 Å/minute, about 9,000 Å/min, about 9,500 Å/min, 9,700 Å/min, and 10,000 Å/min. Deposition rates increase as film accumulates on the substrate; for a substrate on which a thick layer of film has already accumulated, the deposition rate may be around 20,000-30,000 Å/min. Liquid TEOS and oxidant (in gaseous form) flow rates are high in order to deposit the film at a high deposition rate. For example, the liquid TEOS flow rate prior to vaporization may range from about 11-17 ml/min. In particular embodiments, the liquid TEOS flow rate prior to vaporization may be at least about 13 ml/min, 14 ml/min, or 15 ml/min. Preferably the liquid TEOS flow rate prior to vaporization is about 14 ml/min. The oxidant can be $O_2$ or ozone, wherein the oxidant is preferably $O_2$. Oxidant flow rates may range from about 15,200 sccm-23,000 sccm, or in particular embodiments from about 18,000-20,000 sccm, and preferably about 19,000 sccm.

According to various embodiments, helium flow rates range from about 1000-5000 sccm, and from about 3,000-5,000 sccm, or about 3,500-4,500 sccm in certain embodiments, and preferably about 4,000 sccm. The addition of helium to the process gas mixture increases the plasma density and number of electrons (i.e., electron density) in the plasma towards an outer periphery of the processing region above the upper surface of a semiconductor substrate so as to increase the TEOS oxide deposition rate towards the outer periphery of the semiconductor substrate during processing. Further beneficial effects of the addition of helium to the process gas mixture are discussed in commonly assigned U.S. Pat. No. 7,923,376, which is incorporated by reference herein in its entirety.

According to various embodiments, argon flow rates range from about 2,000 to 6,000 sccm, or about 3,000 to 5,000 sccm. Providing argon in the process gas mixture increases the number of electrons (i.e., electron density) in the plasma and the plasma density towards the center of the processing region above the upper surface of the semiconductor substrate so as to increase TEOS oxide deposition rates towards the center of the semiconductor substrate during processing. Thus, by controlling the respective flow rates of the argon and helium in the process gas mixture, the deposition rate of TEOS oxide film across the entire upper surface of a semiconductor substrate may be controlled such that the seam effect of a deposited TEOS oxide film in a trench formed in the upper surface of a semiconductor may be minimized.

The total flow rate of process gas and other conditions in the vacuum chamber can vary depending upon, among other factors, RF power, chamber pressure, substrate surface temperature, and substrate size. The above flow rates are for 300 mm semiconductor wafers; one of skill in the understand that the flow rates may be adjusted for high deposition rate PECVD of TEOS oxide on 200 mm or 450 mm sized substrates or larger substrates such as substrates for flat panel devices. Substrate temperature is about 300° C.-550° C., and preferably about 375° C. wherein the temperature nonuniformity is preferably less than 2° C. across the substrate.

Applications of PECVD TEOS oxide film may include trench fill operations, interlayer dielectrics, dielectric gap fill, gate dielectrics, barrier and cap layers. As indicated above, silicon oxide films deposited with TEOS have improved conformality and step coverage when argon is included in the process gas over PECVD processes that do not use argon. Further, embodiments of methods disclosed herein may incorporate other processes; for example, PECVD TEOS gap fill processes may alternate sputter etch steps with TEOS oxide deposition.

Relative flow rates of the reactant gases as well as RF power may depend on the desired characteristics of the deposited film. For example, in certain applications, a tensile film is required. The etch selectivity is controlled by the film stress. Therefore, film stress may be controlled in order to tailor the etch selectivity for a given application. Preferably, deposited films may have a tensile film stress of between about 0 to 150 Mpa; and in certain embodiments, of at least 50 Mpa.

In embodiments, the desired film has high compressive film stress, for example in a trench fill application. Preferably, the resulting film may have a compressive film stress between about 150-400 Mpa.

Figure 3A:
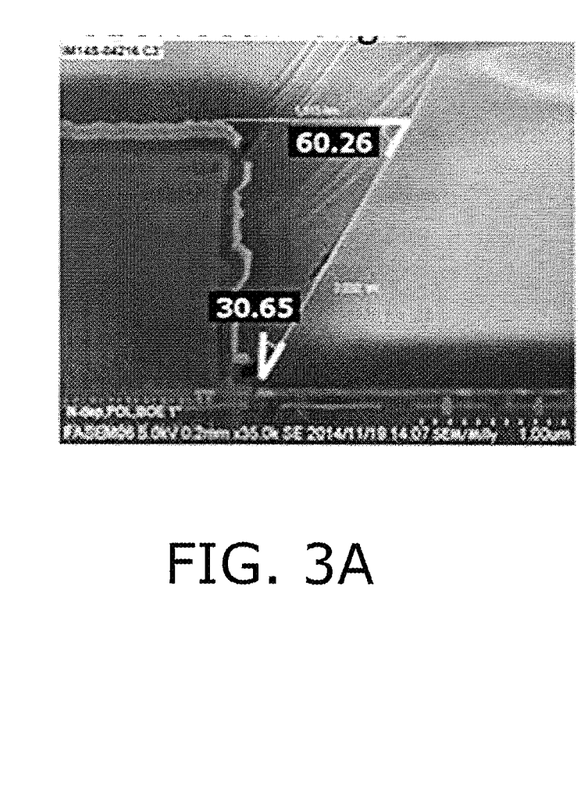
FIG. 3A shows a seam angle formed as a result of a prior art TEOS oxide deposition process on a DRAM cell feature of a semiconductor substrate.

FIG. 3A shows an embodiment of a prior art deposition trench fill process of a TEOS oxide film on a semiconductor substrate having a liquid TEOS flow rate prior to vaporization of 14 ml/min, a helium flow rate of 1,000 sccm, and an $O_2$ flow rate of 15,000 sccm. During deposition, the vacuum chamber was maintained at about 2.4 Torr, and the high-frequency RF generator was powered at about 250 W and the low-frequency RF generator was powered at about 2220 W. As shown in FIG. 3A, the seam effect is present wherein the deposited TEOS oxide film has a seam angle of about 60 degrees and cracks have formed in the deposited material after a wet clean process has been performed on the semiconductor substrate.

Figure 3B:
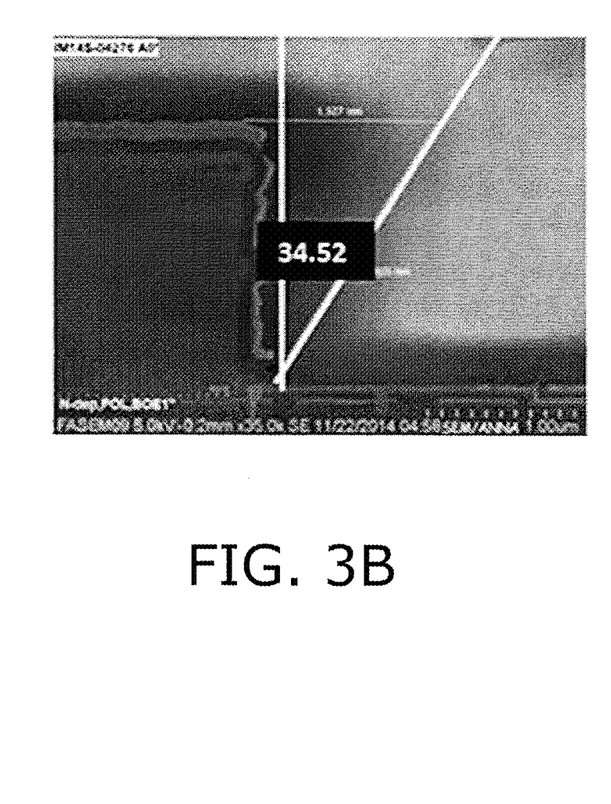
FIG. 3B shows a seam angle formed as a result of TEOS oxide deposition process preformed according to an embodiment disclosed herein on a DRAM cell feature of a semiconductor substrate.

According to a preferred embodiment of a method as disclosed herein, and as illustrated by FIG. 3B, the seam effect has been minimized as the seam angle of the deposited material has been reduced to about 55 degrees. In this embodiment cracks have not formed in the deposited material after the wet cleaning process has been performed. To achieve the minimized seam effect, the plasma deposition process included a liquid TEOS flow rate of about 14 ml/min prior to vaporization, a helium flow rate of about 4,000 sccm, an argon flow rate of 3,000 sccm, and an $O_2$ flow rate of about 19,000 sccm. During deposition, the vacuum chamber was maintained at about 4 Torr, and the high-frequency RF generator was powered at about 1,400 W and the low-frequency RF generator was powered at about 1,950 W.

Figure 4A:
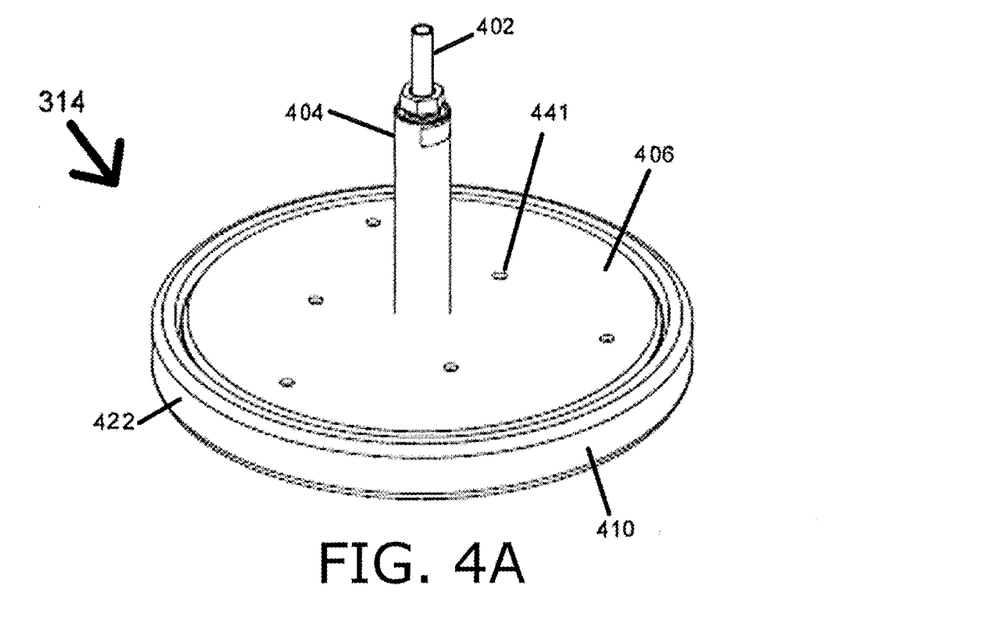
FIGS. 4A and 4B illustrate an embodiment of a showerhead assembly of a semiconductor substrate plasma processing apparatus according to an embodiment as disclosed herein.
Figure 4B:
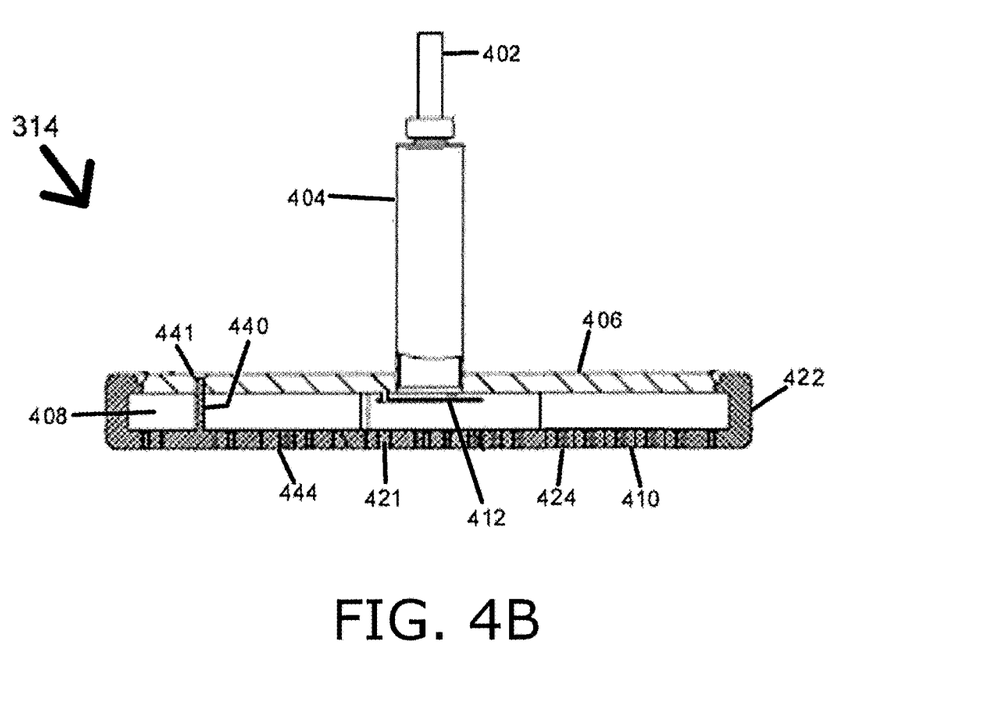

FIGS. 4A and 4B illustrate an embodiment of a showerhead assembly 314 which may be used in accordance with embodiments of methods as disclosed herein. The showerhead assembly 314 includes a stem 404, a back plate 406, and a face plate 410. The face plate 410 preferably includes a lower wall 421 and an annular wall 422 extending upwardly from an outer periphery of the lower wall 421. The lower wall 421 includes a plasma exposed surface 424. The diameter of a plasma exposed surface 424 of the face plate 410 may be slightly larger than the diameter of semiconductor substrate supported below the plasma exposed surface 424 of the face plate 410, preferably about 100% to 125% the diameter of the semiconductor substrate. For example, for a 300 mm (12 inch) diameter semiconductor substrate, the diameter of the plasma exposed surface 424 of the face plate 410 may be about 13-15 inches.

The lower wall 421 of the face plate 410 and the back plate 406 may each have a thickness of about 0.125 to 0.5 inch, or about 0.25 to 0.5 inch, or about 0.25-0.375 inch. Preferably, the lower wall 421 of the face plate 410 has a thickness of 0.375 inch such that minimal thermal gradients are formed across the plasma exposed surface 424 of the face plate 410. The face plate 410 may be made of aluminum or an aluminum alloy, anodized or coated aluminum, or other metal that is formulated to be high temperature, chemical and plasma resistant. The back plate 406 may be made of aluminum or an aluminum alloy, anodized or coated aluminum, or other metal that is formulated to be high temperature, chemical and/or plasma resistant.

In an embodiment, the back plate 406 is about 0.5 inch thick, and the lower wall 421 of the face plate 410 is about 0.375 inch. The back plate 406 mates with the upwardly extending annular wall 422 of the face plate 410 such that a cavity 408 is formed between the lower wall 421 of the face plate 410 and the back plate 406. Preferably the back plate 406 is welded to the upwardly extending annular wall 422 of the face plate 410 so as to integrally couple the face plate 410 to the back plate 406. In an alternate embodiment, screws may be used to releasably couple the face plate 410 to the back plate 406.

A stem 404 extends upwardly from the back plate 406 of the showerhead assembly 314. In an embodiment, a lower end of the stem 404 may be welded to the back plate 406. Reactant gases are introduced through a gas inlet channel 402 in the stem 404, flow past the back plate 406 and enter the cavity 408 between the back plate 406 and the face plate 410. A baffle 412 disposed in the cavity 408 distributes the gases evenly throughout the cavity 408. The baffle 412 may be attached to the back plate 406 via threaded inserts or threaded holes (not shown) in the baffle plate and a number of screws, or alternatively the baffle 412 may be welded to the back plate 406.

The volume of the cavity 408 is defined by the gap between the back plate 406 and the face plate 410. The gap may be about 0.5 to 1 inch, preferably about 0.75 inch. To maintain uniform gas flow in the gap, the size of the gap may be kept constant with a number of posts 440 positioned between the back plate 406 and the face plate 410 at various locations, e.g. 3, 6, or up to 10 locations. Preferably, the face plate 410 includes the posts 440 formed integrally therein and the back plate 406 includes corresponding openings 441 arranged to receive upper ends of the posts 440 when the back plate 406 is coupled to the face plate 410. Preferably, the upper ends of the posts 440 are welded to the back plate 406. The face plate 410 includes gas injection holes 444 (see FIG. 5A) such that process gas delivered into the cavity 408 of the showerhead assembly 314 may be ejected through the gas injection holes 444 to a processing region above a semiconductor substrate, and material, such as a TEOS oxide film, may be deposited on the upper surface of the semiconductor substrate disposed below the plasma exposed surface 424 of the lower wall 421 of the face plate 410 of the showerhead assembly 314.

Figure 5A:
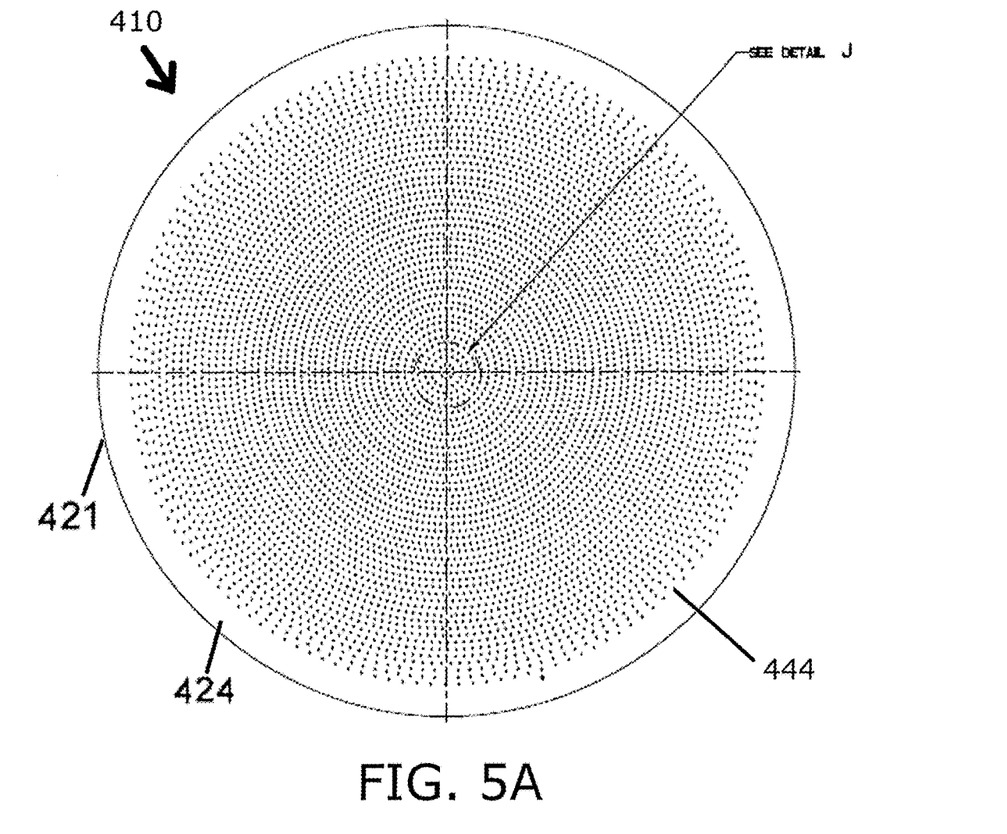
FIG. 5A illustrates an embodiment of a face plate of a showerhead assembly of a semiconductor substrate plasma processing apparatus according to an embodiment as disclosed herein.
Figure 5B:
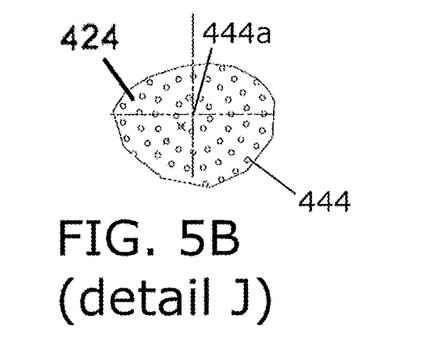
FIG. 5B shows a magnified view of Detail J of FIG. 5A.

FIG. 5A shows an embodiment of a plasma exposed surface 424 of a lower wall 421 of a face plate 410 of a showerhead assembly 314 (see FIG. 4) according to an embodiment as disclosed herein, and FIG. 5B shows a magnified view of Detail J of FIG. 5A. As shown in FIG. 5A, the face plate 410 includes a plurality of gas injection holes or openings 444 that each extend through the thickness of the lower wall 421 of the face plate 410 such that process gas may be supplied (ejected) through the face plate 410. The gas injection holes 444 are spatially arranged in the lower wall 421 of the face plate 410 such that uniform deposition may be effected across the entire upper surface of a semiconductor substrate when processed in accordance with an embodiment of a method as disclosed herein. In an embodiment, at least 6,000 gas injection holes 444 are spatially arranged in the lower wall of the face plate 410 such that process gas delivered into the cavity 408 (see FIG. 4B) and ejected through the at least 6,000 gas injection holes 444 minimizes a seam effect of TEOS oxide film deposited in at least one trench of a semiconductor substrate during a TEOS oxide trench filling operation.

The gas injection holes 444 may be machined, milled, or drilled. Each gas injection hole 444 may have a diameter of about 0.01 to 0.5 inch, and preferably a diameter of about 0.04 inch. Alternatively, the gas injection holes 444 can include smaller diameter holes and larger diameter holes. In an embodiment, some of the gas injection holes 444 may have different sizes. For example, the face plate can include the optional center gas injection hole 444a (see FIG. 5B) wherein the diameter of the center gas injection hole 444b is greater than, equal to, or smaller than the diameter of the remaining gas injection holes 444. In an embodiment, the gas injection holes 444 in the concentric rows of gas injection holes each have the same diameter, or alternatively the gas injection holes 444 in a concentric row of gas injection holes 444 have a diameter that is greater than or smaller than an adjacent concentric row of gas injection holes. In a preferred embodiment, the face plate 410 includes the center gas injection hole 444a wherein the center gas injection hole 444a has a diameter of about 0.02 inch and the remaining gas injection holes 444 which surround the center gas injection hole 444a each have a diameter of about 0.04 inch.

The arrangement of the gas injection holes 444 and respective diameters of each of the gas injection holes 444, including the optional center gas injection hole 444a, control the distribution of the process gas supplied through the face plate 410 and thereby the residence time of the constituents of the process gas flowed across the upper surface of a semiconductor substrate. In an embodiment, the face plate 410 includes at least about 6,000 gas injection holes 444. The gas injection holes 444 are arranged in concentric rows that surround the center of the face plate 410 wherein the distance between adjacent gas injection holes 444 in each concentric row of gas injection holes are preferably equidistantly spaced around the center of the face plate 410.

Preferably, the face plate 410 includes a center gas injection hole 444a (see FIG. 5B) and a plurality of concentric rows of gas injection holes 444 surrounding the center gas injection hole 444a. In an embodiment the face plate 410 does not include the center gas injection hole 444a.

In an embodiment, as shown in FIG. 5A, the face plate 410 includes forty-five concentric rows of gas injection holes 444 surrounding the optional center gas injection hole 444a (see FIG. 5B) wherein the first concentric row has nine gas injection holes located at a radial distance of about 0.1-0.2 inch from the center of the face plate 410, the second concentric row has sixteen gas injection holes located at a radial distance of about 0.2-0.3 inch from the center of the face plate 410, the third concentric row has twenty-one gas injection holes located at a radial distance of about 0.4-0.5 inch from the center of the face plate 410, the fourth concentric row has twenty-seven gas injection holes located at a radial distance of about 0.5-0.6 inch from the center of the face plate 410, the fifth concentric row has thirty-four gas injection holes located at a radial distance of about 0.6-0.7 inch from the center of the face plate 410, the sixth concentric row has forty-four gas injection holes located at a radial distance of about 0.7-0.8 inch from the center of the face plate 410, the seventh concentric row has forty-nine gas injection holes located at a radial distance of about 0.9-1 inch from the center of the face plate 410; the eighth concentric row has fifty-six gas injection holes located at a radial distance of about 1-1.1 inches from the center of the face plate 410, the ninth concentric row has sixty-two gas injection holes located at a radial distance of about 1.1-1.2 inches from the center of the face plate 410, the tenth concentric row has seventy gas injection holes located at a radial distance of about 1.25-1.35 inches from the center of the face plate 410, the eleventh concentric row has eighty-three gas injection holes located at a radial distance of about 1.4-1.5 inches from the center of the face plate 410, the twelfth concentric row has eighty-six gas injection holes located at a radial distance of about 1.5-1.6 inches from the center of the face plate 410, the thirteenth concentric row has ninety-five gas injection holes located at a radial distance of about 1.7-1.8 inches from the center of the face plate 410, the fourteenth concentric row has ninety-seven gas injection holes located at a radial distance of about 1.8-1.9 inches from the center of the face plate 410, the fifteenth concentric row has one hundred seven gas injection holes located at a radial distance of about 1.9-2 inch from the center of the face plate 410, the sixteenth concentric row has one hundred eighteen gas injection holes located at a radial distance of about 2.05-2.15 inches from the center of the face plate 410, the seventeenth concentric row has one hundred sixteen gas injection holes located at a radial distance of about 2.2-2.3 inches from the center of the face plate 410, the eighteenth concentric row has one hundred twenty-seven gas injection holes located at a radial distance of about 2.3-2.4 inches from the center of the face plate 410, the nineteenth concentric row has one hundred twenty-seven gas injection holes located at a radial distance of about 2.4-2.5 inches from the center of the face plate 410, the twentieth concentric row has one hundred thirty-nine gas injection holes located at a radial distance of about 2.55-2.65 inch from the center of the face plate 410, the twenty-first concentric row has one hundred fifty-nine gas injection holes located at a radial distance of about 2.7-2.8 inches from the center of the face plate 410, the twenty-second concentric row has one hundred sixty-two gas injection holes located at a radial distance of about 2.8-2.9 inches from the center of the face plate 410, the twenty-third concentric row has one hundred sixty-five gas injection holes located at a radial distance of about 3-3.1 inches from the center of the face plate 410, the twenty-fourth concentric row has one hundred seventy-one gas injection holes located at a radial distance of about 3.1-3.2 inches from the center of the face plate 410, the twenty-fifth concentric row has one hundred seventy gas injection holes located at a radial distance of about 3.2-3.3 inches from the center of the face plate 410, the twenty-sixth concentric row has one hundred seventy-eight gas injection holes located at a radial distance of about 3.35-3.45 inches from the center of the face plate 410, the twenty-seventh concentric row has one hundred eighty-six gas injection holes located at a radial distance of about 3.5-3.6 inches from the center of the face plate 410, the twenty-eighth concentric row has one hundred eighty-five gas injection holes located at a radial distance of about 3.6-3.7 inches from the center of the face plate 410, the twenty-ninth concentric row has one hundred ninety-five gas injection holes located at a radial distance of about 3.75-3.85 inches from the center of the face plate 410, the thirtieth concentric row has one hundred ninety-five gas injection holes located at a radial distance of about 3.9-4 inches from the center of the face plate 410, the thirty-first concentric row has two hundred gas injection holes located at a radial distance of about 4-4.1 inches from the center of the face plate 410, the thirty-second concentric row has two hundred two gas injection holes located at a radial distance of about 4.15-4.25 inches from the center of the face plate 410, the thirty-third concentric row has two hundred five gas injection holes located at a radial distance of about 4.3-4.4 inches from the center of the face plate 410, the thirty-fourth concentric row has two hundred ten gas injection holes located at a radial distance of about 4.4-4.5 inches from the center of the face plate 410, the thirty-fifth concentric row has two hundred fourteen gas injection holes located at a radial distance of about 4.5-4.6 inches from the center of the face plate 410, the thirty-sixth concentric row has two hundred fifteen gas injection holes located at a radial distance of about 4.7-4.8 inches from the center of the face plate 410, the thirty-seventh concentric row has two hundred twelve gas injection holes located at a radial distance of about 4.8-4.9 inches from the center of the face plate 410, the thirty-eighth concentric row has two hundred twelve gas injection holes located at a radial distance of about 4.9-5 inches from the center of the face plate 410, the thirty-ninth concentric row has two hundred fourteen gas injection holes located at a radial distance of about 5.1-5.2 inches from the center of the face plate 410, the fortieth concentric row has two hundred twelve gas injection holes located at a radial distance of about 5.2-5.3 inches from the center of the face plate 410, the forty-first concentric row has two hundred ten gas injection holes located at a radial distance of about 5.3-5.4 inches from the center of the face plate 410, the forty-second concentric row has one hundred ninety-eight gas injection holes located at a radial distance of about 5.45-5.55 inches from the center of the face plate 410, the forty-third concentric row has one hundred sixty gas injection holes located at a radial distance of about 5.6-5.7 inches from the center of the face plate 410, the forty-fourth concentric row has one hundred sixty gas injection holes located at a radial distance of about 5.7-5.8 inch from the center of the face plate 410, and the forty-fifth concentric row has one hundred forty gas injection holes located at a radial distance of about 5.85-5.95 inches from the center of the face plate 410. Preferably the gas injection holes 444 of each concentric row of gas injection holes are equidistantly spaced around the center of the face plate 410 (i.e., the distance between adjacent gas injection holes in each concentric row of gas injection holes is about the same).

Referring back to FIG. 1, the semiconductor substrate plasma processing apparatus 300 includes a controller 162 which may be integrated with electronics for controlling the operation of embodiments of the semiconductor substrate plasma processing apparatus 300 as disclosed herein and for performing embodiments of methods as disclosed herein. The electronics may be referred to as the "controller," which may control various components or subparts of the system or sub-systems.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 162, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 162 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level (i.e. a processing module) or as part of a remote computer) that combine to control a process in the chamber.

As noted above, depending on the process step or steps to be performed by the semiconductor substrate plasma processing apparatus 300, the controller 162 thereof might communicate with one or more of other tool circuits or modules, other tool components, cluster tools, other tool interfaces, adjacent tools, neighboring tools, tools located throughout a factory, a main computer, another controller, or tools used in material transfer that bring containers of wafers to and from tool locations and/or load ports in a semiconductor manufacturing factory. Preferably, a non-transitory computer machine-readable medium includes program instructions for control of the semiconductor substrate plasma processing apparatus 300.

In an embodiment the method of minimizing a seam effect of a deposited TEOS oxide film during a trench filling process performed on a semiconductor substrate in a semiconductor substrate plasma processing apparatus comprises supporting a semiconductor substrate on a pedestal in a vacuum chamber of the semiconductor substrate plasma processing apparatus wherein the semiconductor substrate includes at least one trench in an upper surface thereof. Process gas including TEOS, an oxidant, and argon is flowed through a face plate of a showerhead assembly of the semiconductor substrate plasma processing apparatus into a processing region of the vacuum chamber above the upper surface of the semiconductor substrate. RF energy is supplied into the processing region of the vacuum chamber with at least one RF generator to energize the process gas into a plasma, wherein the TEOS oxide film is deposited on the upper surface of the semiconductor substrate so as to fill the at least one trench thereof wherein the argon is supplied in an amount sufficient to increase the electron density of the plasma such that the deposition rate of the TEOS oxide film towards the center of the semiconductor substrate is increased and the seam effect of the deposited TEOS oxide film in the at least one trench is reduced.

Preferably, the process gas further includes helium wherein the helium is supplied to the vacuum chamber at a flow rate sufficient to increase the electron density of the plasma such that the deposition rate of the TEOS oxide film towards the outer periphery of the semiconductor substrate is increased and the seam effect of the deposited TEOS oxide film in the at least one trench is reduced.

In an embodiment RF energy is supplied into the processing region of the vacuum chamber with a high-frequency RF generator powered at about 1,100 to 1,700 W and supplying RF energy into the processing region of the vacuum chamber with a low-frequency RF generator powered at about 1,550 to 2,400 W, and the vacuum chamber is maintained at a pressure of about 3-5 Torr or about 4 Torr during the processing wherein the TEOS oxide film is preferably deposited to a thickness of about 1,000 Angstroms to 30,000 Angstroms.

Embodiments disclosed herein have been described with reference to preferred embodiments. However, it will be readily apparent to those skilled in the art that it is possible to embody the invention in specific forms other than as described above without departing from the spirit of the invention. The preferred embodiments are illustrative and should not be considered restrictive in any way.

What is claimed is:

1. A showerhead assembly of a semiconductor substrate plasma processing apparatus, the showerhead assembly comprising:
   a face plate including a lower wall and an annular outer wall extending upwardly from an outer periphery of the lower wall; and
   a back plate wherein the upwardly extending annular wall of the face plate is welded to an outer periphery of a back plate such that a cavity is formed between the lower wall of the face plate and the back plate;

wherein the lower wall of the face plate includes at least 6,000 gas injection holes that extend therethrough wherein the at least 6,000 gas injection holes are spatially arranged in the lower wall of the face plate such that process gas delivered through the at least 6,000 gas injection holes minimizes a seam effect of TEOS oxide film deposited in at least one trench of a semiconductor substrate during a TEOS oxide trench filling operation.

2. The showerhead assembly of claim 1, wherein the lower wall of the face plate includes an optional center gas injection hole and 45 concentric rows of gas injection holes surrounding the optional center hole wherein the first concentric row has nine gas injection holes located at a radial distance of about 0.1-0.2 inch from the center of the face plate, the second concentric row has sixteen gas injection holes located at a radial distance of about 0.2-0.3 inch from the center of the face plate, the third concentric row has twenty-one gas injection holes located at a radial distance of about 0.4-0.5 inch from the center of the face plate, the fourth concentric row has twenty-seven gas injection holes located at a radial distance of about 0.5-0.6 inch from the center of the face plate, the fifth concentric row has thirty-four gas injection holes located at a radial distance of about 0.6-0.7 inch from the center of the face plate, the sixth concentric row has forty-four gas injection holes located at a radial distance of about 0.7-0.8 inch from the center of the face plate, the seventh concentric row has forty-nine gas injection holes located at a radial distance of about 0.9-1 inch from the center of the face plate, the eighth concentric row has fifty-six gas injection holes located at a radial distance of about 1-1.1 inches from the center of the face plate, the ninth concentric row has sixty-two gas injection holes located at a radial distance of about 1.1-1.2 inches from the center of the face plate, the tenth concentric row has seventy gas injection holes located at a radial distance of about 1.25-1.35 inches from the center of the face plate, the eleventh concentric row has eighty-three gas injection holes located at a radial distance of about 1.4-1.5 inches from the center of the face plate, the twelfth concentric row has eighty-six gas injection holes located at a radial distance of about 1.5-1.6 inches from the center of the face plate, the thirteenth concentric row has ninety-five gas injection holes located at a radial distance of about 1.7-1.8 inches from the center of the face plate, the fourteenth concentric row has ninety-seven gas injection holes located at a radial distance of about 1.8-1.9 inches from the center of the face plate, the fifteenth concentric row has one hundred seven gas injection holes located at a radial distance of about 1.9-2 inch from the center of the face plate, the sixteenth concentric row has one hundred eighteen gas injection holes located at a radial distance of about 2.05-2.15 inches from the center of the face plate, the seventeenth concentric row has one hundred sixteen gas injection holes located at a radial distance of about 2.2-2.3 inches from the center of the face plate, the eighteenth concentric row has one hundred twenty-seven gas injection holes located at a radial distance of about 2.3-2.4 inches from the center of the face plate, the nineteenth concentric row has one hundred twenty-seven gas injection holes located at a radial distance of about 2.4-2.5 inches from the center of the face plate, the twentieth concentric row has one hundred thirty-nine gas injection holes located at a radial distance of about 2.55-2.65 inch from the center of the face plate, the twenty-first concentric row has one hundred fifty-nine gas injection holes located at a radial distance of about 2.7-2.8 inches from the center of the face plate, the twenty-second concentric row has one hundred sixty-two gas injection holes located at a radial distance of about 2.8-2.9 inches from the center of the face plate, the twenty-third concentric row has one hundred sixty-five gas injection holes located at a radial distance of about 3-3.1 inches from the center of the face plate, the twenty-fourth concentric row has one hundred seventy-one gas injection holes located at a radial distance of about 3.1-3.2 inches from the center of the face plate, the twenty-fifth concentric row has one hundred seventy gas injection holes located at a radial distance of about 3.2-3.3 inches from the center of the face plate, the twenty-sixth concentric row has one hundred seventy-eight gas injection holes located at a radial distance of about 3.35-3.45 inches from the center of the face plate, the twenty-seventh concentric row has one hundred eighty-six gas injection holes located at a radial distance of about 3.5-3.6 inches from the center of the face plate, the twenty-eighth concentric row has one hundred eighty-five gas injection holes located at a radial distance of about 3.6-3.7 inches from the center of the face plate, the twenty-ninth concentric row has one hundred ninety-five gas injection holes located at a radial distance of about 3.75-3.85 inches from the center of the face plate, the thirtieth concentric row has one hundred ninety-five gas injection holes located at a radial distance of about 3.9-4 inches from the center of the face plate, the thirty-first concentric row has two hundred gas injection holes located at a radial distance of about 4-4.1 inches from the center of the face plate, the thirty-second concentric row has two hundred two gas injection holes located at a radial distance of about 4.15-4.25 inches from the center of the face plate, the thirty-third concentric row has two hundred five gas injection holes located at a radial distance of about 4.3-4.4 inches from the center of the face plate, the thirty-fourth concentric row has two hundred ten gas injection holes located at a radial distance of about 4.4-4.5 inches from the center of the face plate, the thirty-fifth concentric row has two hundred fourteen gas injection holes located at a radial distance of about 4.5-4.6 inches from the center of the face plate, the thirty-sixth concentric row has two hundred fifteen gas injection holes located at a radial distance of about 4.7-4.8 inches from the center of the face plate, the thirty-seventh concentric row has two hundred twelve gas injection holes located at a radial distance of about 4.8-4.9 inches from the center of the face plate, the thirty-eighth concentric row has two hundred twelve gas injection holes located at a radial distance of about 4.9-5 inches from the center of the face plate, the thirty-ninth concentric row has two hundred fourteen gas injection holes located at a radial distance of about 5.1-5.2 inches from the center of the face plate, the fortieth concentric row has two hundred twelve gas injection holes located at a radial distance of about 5.2-5.3 inches from the center of the face plate, the forty-first concentric row has two hundred ten gas injection holes located at a radial distance of about 5.3-5.4 inches from the center of the face plate, the forty-second concentric row has one hundred ninety-eight gas injection holes located at a radial distance of about 5.45-5.55 inches from the center of the face plate, the forty-third concentric row has one hundred sixty gas injection holes located at a radial distance of about 5.6-5.7 inches from the center of the face plate, the forty-fourth concentric row has one hundred sixty gas injection holes located at a radial distance of about 5.7-5.8 inch from the center of the face plate, and the forty-fifth concentric row has one hundred forty gas injection holes located at a radial distance of about 5.85-5.95 inches from the center of the face plate.

3. The showerhead assembly of claim 1, wherein
(a) the face plate includes the optional center gas injection hole and the diameter of the center gas injection hole is greater than, equal to, or smaller than the diameter of the remaining gas injection holes; and/or
(b) the gas injection holes in the concentric rows of gas injection holes each have the same diameter or the gas injection holes in a concentric row of gas injection holes have a diameter that is greater than or smaller than an adjacent concentric row of gas injection holes.

4. The showerhead assembly of claim 1, wherein
(a) the face plate includes a plurality of posts in the cavity extending upwardly from the lower wall thereof wherein upper ends of the posts are welded in corresponding openings of the back plate in which the upper ends of the posts are located;
(b) a stem extends upwardly from the back plate of the showerhead assembly; and
(c) a baffle is disposed in the cavity of the showerhead assembly wherein the baffle is operable to evenly distribute process gas supplied to the showerhead assembly throughout the cavity.

5. A semiconductor substrate plasma processing apparatus comprising the showerhead assembly of claim 1 wherein the semiconductor substrate plasma processing apparatus is a plasma enhanced chemical vapor deposition apparatus or a plasma enhanced atomic layer deposition apparatus.

6. The semiconductor substrate plasma processing apparatus of claim 5, further comprising a controller and machine readable medium comprising program instructions for control of the semiconductor substrate plasma processing apparatus.

7. A method of minimizing a seam effect of a deposited TEOS oxide film during a trench filling process performed on a semiconductor substrate in a semiconductor substrate plasma processing apparatus, the method comprising:
supporting a semiconductor substrate on a pedestal in a vacuum chamber of the semiconductor substrate plasma processing apparatus wherein the semiconductor substrate includes at least one trench in an upper surface thereof;
flowing process gas including TEOS, an oxidant, and argon through the face plate of the showerhead assembly of claim 1 into a processing region of the vacuum chamber above the upper surface of the semiconductor substrate;
supplying RF energy into the processing region of the vacuum chamber with at least one RF generator to energize the process gas into a plasma; and
depositing TEOS oxide film on the upper surface of the semiconductor substrate so as to fill the at least one trench thereof wherein the argon is supplied in an amount sufficient to increase the electron density of the plasma such that the deposition rate of the TEOS oxide film towards the center of the semiconductor substrate is increased and the seam effect of the deposited TEOS oxide film in the at least one trench is reduced.

8. The method of claim 7, wherein the argon is supplied to the vacuum chamber at a flow rate of about 2,000 to 6,000 sccm, about 3,000 to 5,000 sccm, or about 4,000 sccm.

9. The method of claim 7, wherein the process gas further includes helium wherein the helium is supplied to the vacuum chamber at a flow rate sufficient to increase the electron density of the plasma such that the deposition rate of the TEOS oxide film towards the outer periphery of the semiconductor substrate is increased and the seam effect of the deposited TEOS oxide film in the at least one trench is reduced.

10. The method of claim 9, wherein the helium is supplied to the vacuum chamber at a flow rate of about 3,000-5,000 sccm, about 3,500-4,500 sccm, or about 4,000 sccm.

11. The method of claim 9, wherein the flow rate of liquid TEOS prior to vaporization is about 14 ml/min, the flow rate of helium is about 4,000 sccm, the flow rate of argon is about 3,000 sccm, and the flow rate of $O_2$ flow rate of about 19,000 sccm.

12. The method of claim 11, wherein the power of the high-frequency RF generator is about 1,400 W, the power of the low-frequency RF generator is about 1,950 W and maintaining the pressure in the vacuum chamber at about 4 Torr.

13. The method of claim 7, wherein the oxidant is $O_2$ or ozone, and the oxidant is supplied to the vacuum chamber at a flow rate of about 15,000 sccm-23,000 sccm, about 18,000-20,000 sccm, or about 19,000 sccm.

14. The method of claim 7, wherein supplying RF energy into the processing region of the vacuum chamber with at least one RF generator comprises supplying RF energy at a frequency of about 2 to 60 MHz into the processing region of the vacuum chamber with a high-frequency RF generator powered at about 1,100 to 1,700 W and supplying RF energy at a frequency of about 50 to 800 kHz into the processing region of the vacuum chamber with a low-frequency RF generator powered at about 1,550 to 2,400 W.

15. The method of claim 7, wherein the vacuum chamber is maintained at a pressure of about 3-5 Torr or about 4 Torr.

16. The method of claim 7, further comprising flowing liquid TEOS at a flow rate of about 11-17 ml/min or about 14 rill/min to a heated manifold operable to vaporize the liquid TEOS wherein the heated manifold is in fluid communication with the showerhead assembly such that the vaporized TEOS may be flowed through the face plate of the showerhead assembly to the processing region above the semiconductor substrate.

17. The method of claim 7, wherein the TEOS oxide film is deposited to a thickness of about 1,000 Angstroms to 30,000 Angstroms.

18. The method of claim 7, wherein the resulting TEOS oxide film has a tensile film stress of about 0 to 150 Mpa.

19. The method of claim 7, wherein the resulting TEOS oxide film has a compressive film stress of between 150-400 Mpa.

* * * * *